(12) United States Patent
Somekh et al.

(10) Patent No.: US 6,352,467 B1
(45) Date of Patent: Mar. 5, 2002

(54) INTEGRATED ELECTRODEPOSITION AND CHEMICAL MECHANICAL POLISHING TOOL

(75) Inventors: Sasson Somekh, Los Altos Hills; Debabrata Ghosh, San Jose; Bret W. Adams, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/591,186

(22) Filed: Jun. 8, 2000

Related U.S. Application Data

(62) Division of application No. 08/966,939, filed on Nov. 10, 1997, now Pat. No. 6,110,011.

(51) Int. Cl.[7] .................................................. B24B 1/00
(52) U.S. Cl. .......................... 451/28; 451/41; 451/288; 438/687
(58) Field of Search ................................ 438/679, 680, 438/687; 451/28, 41, 288

(56) References Cited

U.S. PATENT DOCUMENTS

| | | | |
|---|---|---|---|
| 3,962,834 A | 6/1976 | Ostarch ........................ | 51/323 |
| 4,789,438 A | 12/1988 | Polan ............................ | 204/13 |
| 4,956,313 A | 9/1990 | Cote et al. .................... | 437/203 |
| 5,225,034 A | 7/1993 | Yu et al. ....................... | 156/636 |
| 5,354,490 A | 10/1994 | Yu et al. ....................... | 252/79.1 |
| 5,478,436 A | 12/1995 | Winebarger et al. ...... | 156/636.1 |
| 5,547,415 A | 8/1996 | Hasegawa et al. ............ | 451/44 |
| 5,559,428 A | 9/1996 | Li et al. ...................... | 324/71.5 |
| 5,616,212 A | 4/1997 | Isobe ........................... | 438/693 |
| 5,664,987 A | 9/1997 | Renteln ........................ | 451/21 |
| 5,827,110 A | 10/1998 | Yajima et al. .................. | 451/5 |
| 5,830,045 A | 11/1998 | Togawa et al. .............. | 451/288 |
| 5,893,795 A | 4/1999 | Perlov et al. ................ | 451/288 |
| 5,895,311 A | 4/1999 | Shiotani et al. ................. | 451/5 |
| 5,897,426 A | 4/1999 | Somekh ........................ | 451/41 |
| 5,904,156 A | * 5/1999 | Advocate, Jr. et al. ..... | 438/680 |
| 5,907,791 A | * 5/1999 | Cappuzzo et al. .......... | 438/687 |
| 5,972,192 A | * 10/1999 | Dubin et al. ................. | 438/687 |
| 6,056,864 A | * 5/2000 | Cheung ........................ | 438/687 |
| 6,071,808 A | * 6/2000 | Merchant et al. ........... | 438/687 |
| 6,110,011 A | * 8/2000 | Somekh et al. ............... | 451/28 |

FOREIGN PATENT DOCUMENTS

| | | |
|---|---|---|
| EP | 0 692 554 A1 | 1/1996 |
| EP | 0 805 000 A1 | 5/1997 |

OTHER PUBLICATIONS

Kaufman et al., "Chemical–Mechanical Polishing for Fabricating Patterned W Metal Features as Chip Interconnects," J. Electrochem. Soc., vol. 138, No. 11, Nov. 1991, 3460–3465.

Roberts et al., "Chemical–Mechanical Planarization," IEEE/SEMI, 1992, pp. 206–210.

Thin Solid films, "Copper–based metallization and interconnects for ultra–large–scale integration applications," Elsevier Science, 1995, 13 pages.

* cited by examiner

*Primary Examiner*—Joseph J. Hail, III
*Assistant Examiner*—Lee Wilson
(74) *Attorney, Agent, or Firm*—Fish & Richardson

(57) ABSTRACT

A fabrication tool integrates one or more electrodeposition stations with a CMP apparatus. The tool may transport substrates from the electroplating stations to the CMP apparatus without an intervening cleaning step. In addition, the thickness of an electrodeposited layer may be measured at a metrology station prior to polishing utilizing an instrument which physically contacts the surface of the substrate, and the measured thickness may be used to adjust the polishing parameters. Furthermore, the fabrication tool may have a single interface in which a dry and clean wafer is returned to the interface.

15 Claims, 4 Drawing Sheets

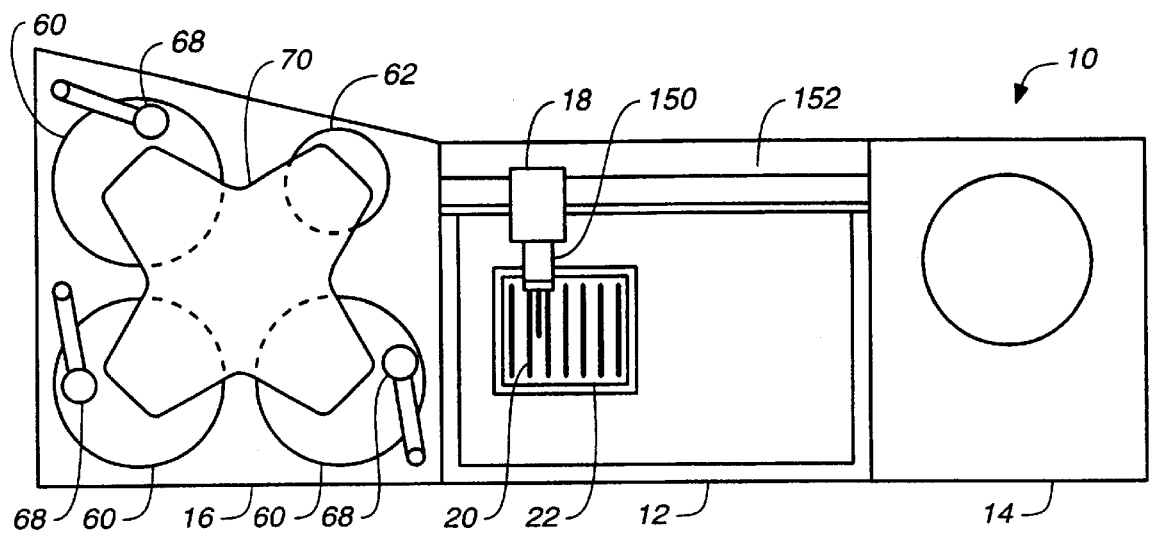
FIG._1
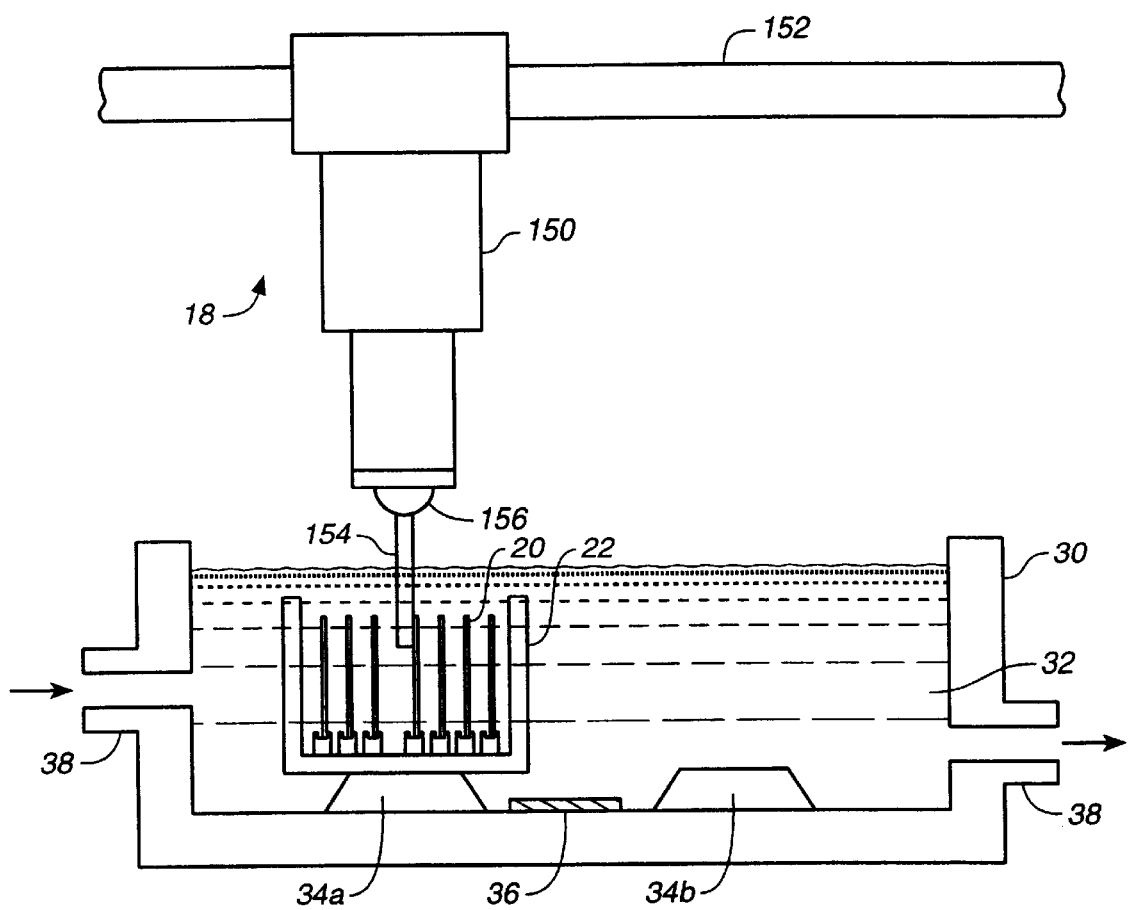
FIG._2

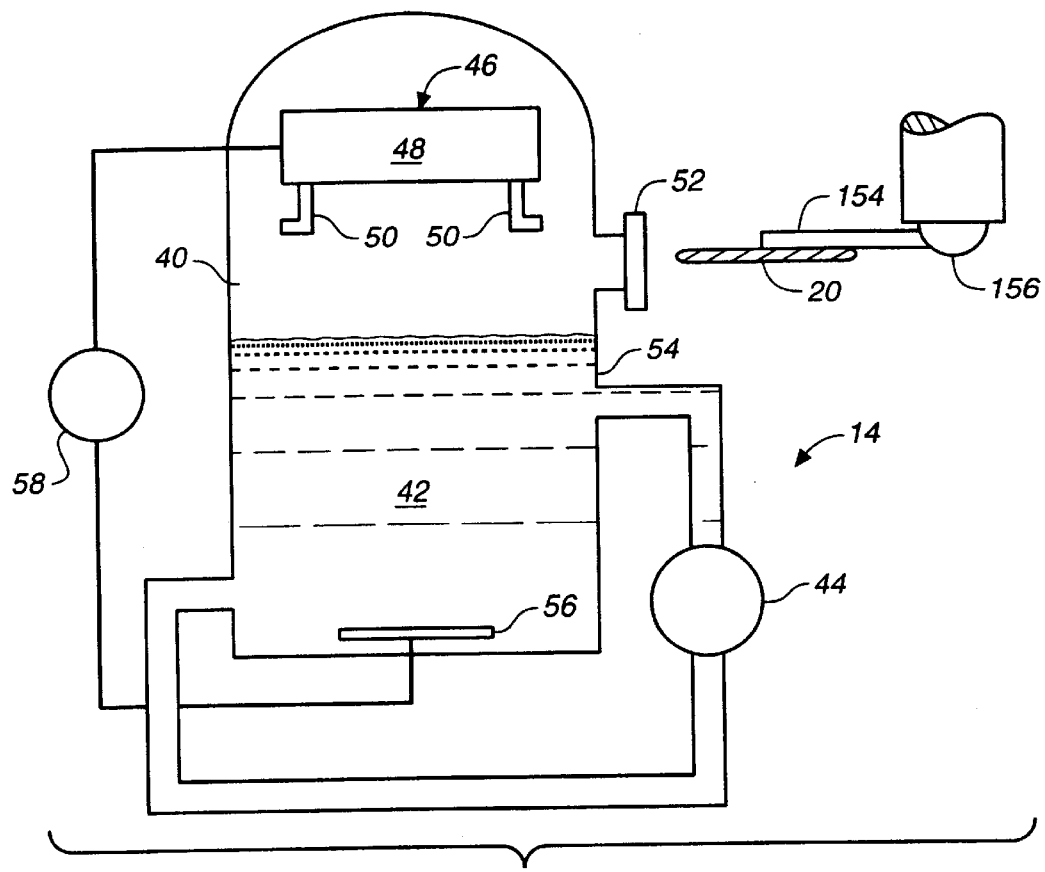
FIG._3
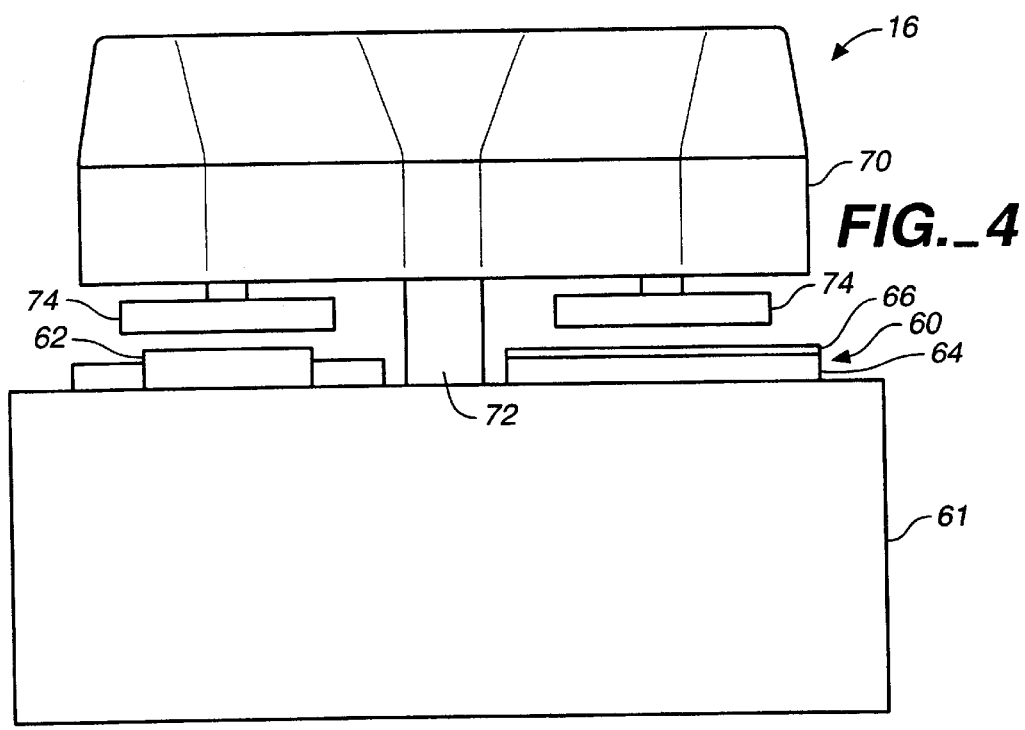
FIG._4

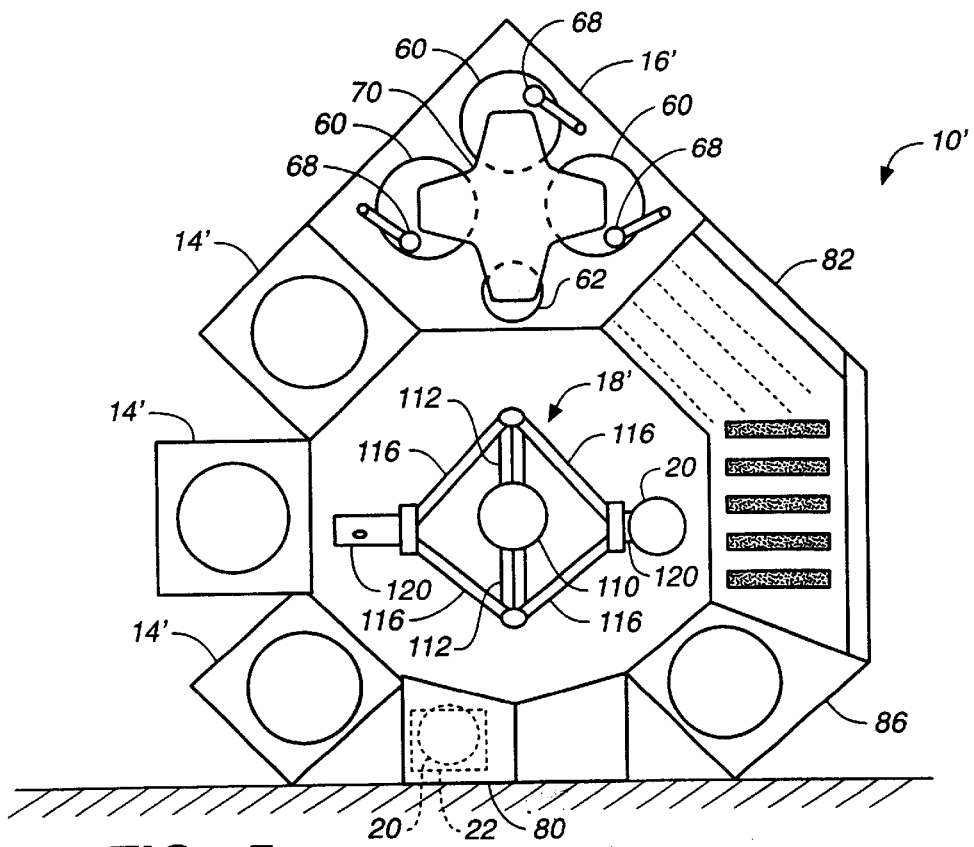
FIG._5
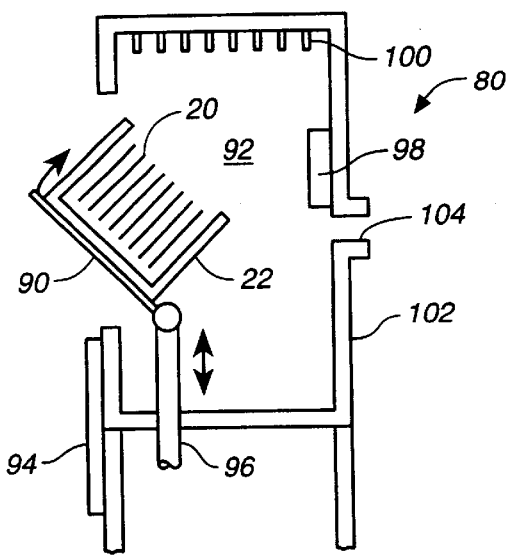
FIG._6
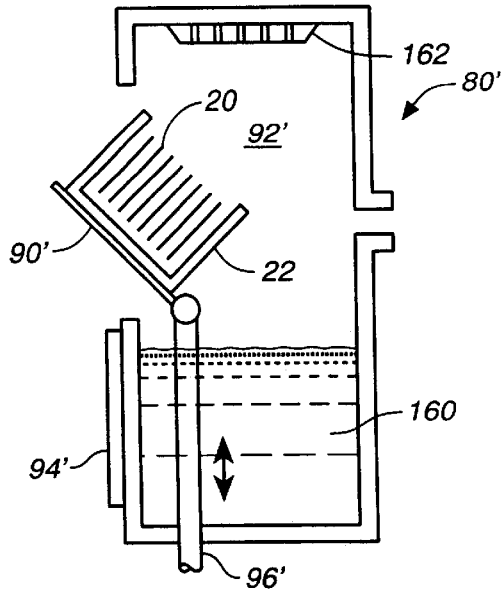
FIG._7

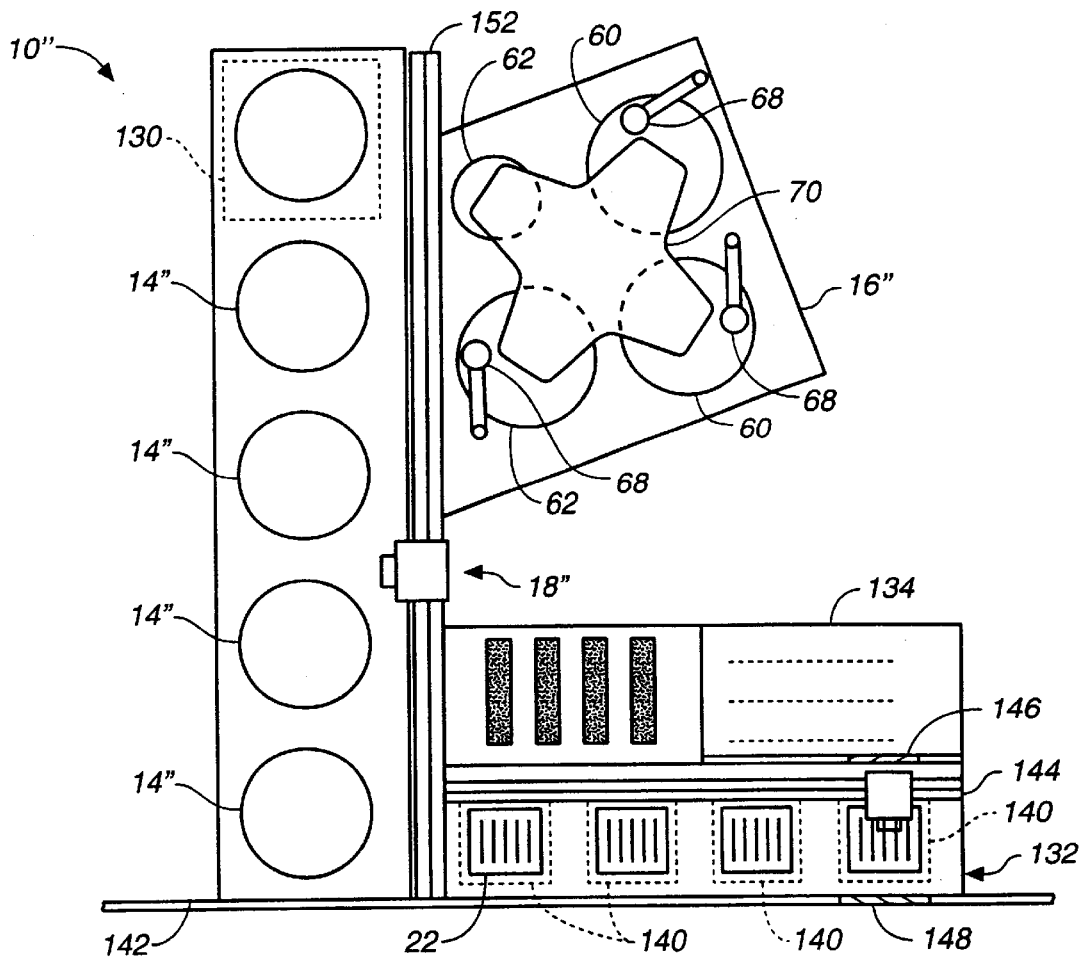
FIG._8
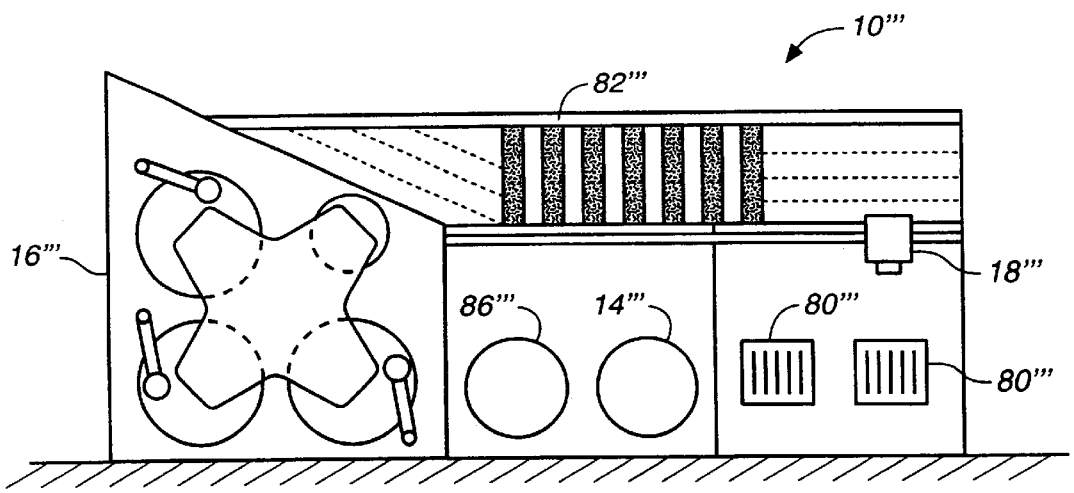
FIG._9

INTEGRATED ELECTRODEPOSITION AND CHEMICAL MECHANICAL POLISHING TOOL

This application is a division of U.S. patent application Ser. No. 08/966,939, filed Nov. 10, 1997 now U.S. Pat. No. 6,110,011.

BACKGROUND

The present invention relates generally to semiconductor device fabrication, and more particularly an integrated tool for performing electrodeposition and chemical-mechanical polishing.

Some semiconductor device fabrication processes require a planarizing step following a metallization step. For example, in one well-known dual inlaid process, referred to as dual damascene, an electrodeposition step may be performed to fill vias, contacts and wiring on the substrate. Once the vias, contacts and wiring have been formed, the metal is planarized to remove excess metal overlying the dielectric layer.

Chemical-mechanical polishing (CMP) is one method of planarizing a substrate. CMP typically requires that the substrate be mounted on a carrier or polishing head in a CMP apparatus. The exposed surface of the substrate is placed against a rotating polishing pad, and an aqueous polishing slurry is supplied to the polishing pad. The interaction of the polishing pad, slurry and substrate results in planarization of the substrate and removal of excess metal. The substrate is then rinsed, to remove the slurry, and dried in a controlled manner to minimize particulates and contamination of the substrate.

Electrodeposition is one method of depositing a metal layer ("metallization") on a substrate. Electrodeposition requires that the substrate be suspended in an aqueous chemical solution. In one method the metal to be deposited is suspended in the solution and a voltage is applied between the substrate (cathode) and the metal (anode). This process is called "electrolytic plating" or "electroplating." In an alternative method an electrochemical reaction deposits the metal layer onto the substrate without an applied voltage. This alternative method is called "electroless plating." Again, as in CMP, the substrate is then rinsed, to remove the chemical solution, and dried in a controlled manner to minimize particulates and contamination of the substrate.

Typically, substrates are dried in a controlled manner after any wet processing. This is because if substrates are allowed to dry by evaporation, contamination concentrations increase as the droplets of water evaporate, causing concentrations of silicon and other contaminants on the substrate which can create defects. However, multiple clean and dry processes reduce the throughput.

SUMMARY

In one aspect, the invention is directed to a method of manufacturing a semiconductor device. A metal layer is electrodeposited onto a substrate, and the metal layer is chemically-mechanically polished. The substrate is not dried between the electrodeposition and polishing step.

Implementations of the invention may include the following. The metal may be copper. The substrate may be extracted from a slot in a cassette, transported to an electrodeposition station for electrodeposition, rinsed, transported to a chemical mechanical polishing apparatus for polishing, cleaned and dried, and returned to the slot in the cassette. The thickness of the metal layer may be measured prior to polishing, and the measured thickness may be used to modify a polishing or electrodeposition parameter. The thickness of the metal layer may be measured after polishing as well.

In another aspect, the invention is directed to an integrated tool for fabricating a semiconductor device. The tool includes an electrodeposition station for electrodepositing a metal layer on a substrate, a chemical mechanical polishing apparatus for polishing the metal layer, and a substrate-handling robot for transporting the substrate between the electrodeposition station and the chemical mechanical polishing station. The electrodeposition station, chemical mechanical polishing apparatus and substrate-handling robot are disposed to form an integrated tool.

Implementations of the invention may include the following. The tool may include a plurality of electrodeposition stations and the chemical mechanical polishing apparatus may include a plurality of polishing stations. The electrodeposition stations and chemical mechanical polishing apparatus may surround the substrate-handling robot in a cluster arrangement, or the substrate-handling robot may move along a linear path to carry the substrate between the electrodeposition stations and chemical mechanical polishing apparatus. There may be a metrology station to measure the thickness of the metal layer prior to polishing at the chemical mechanical polishing station. The metrology station may include a measuring apparatus which directly contacts the metal layer. There may be rinse station, a drying station for drying the substrate by means other than simple evaporation, a wetting station to rinse the substrate with a solution which may include a surfactant, and/or a cleaning station. There may also be a load lock to receive and hold a cassette from outside the tool.

In another aspect, the invention is directed to a method of manufacturing a semiconductor device in an integrated tool. A metal layer is electrodeposited onto a substrate at an electrodeposition station, the thickness of the metal layer is measured at a metrology station, and the metal layer is chemically-mechanically polished at a chemical mechanical polishing apparatus. A polishing parameter is determined by the measured thickness.

Implementations of the invention may include the following. The electrodeposition station, the metrology station, and the chemical mechanical polishing station may be enclosed by a housing to form a single integrated tool. Measuring the thickness may include contacting a surface of the substrate with a metrology instrument.

In another aspect, the invention is directed to a load lock. The load lock includes a chamber having a port for transferring a substrate from the load lock to an interior of a tool, a vertically movable indexing arm, a support for holding a cassette connected to the indexing arm, and means for drying a substrate held in the cassette in the chamber.

Implementations of the invention may include the following. The drying means may include a heater or a nozzle for directing air at the substrate.

In another aspect, the invention is directed to a load lock. The load lock includes a chamber having a port for transferring a substrate from the load lock to an interior of a tool, a vertically movable indexing arm, a support for holding a cassette connected to the indexing arm, and means for cleaning a substrate held in the cassette in the chamber.

In another aspect, the invention is directed to a method of manufacturing a semiconductor device in which a substrate is withdrawn from a cassette, a metal layer is electrodeposited onto the substrate, the metal layer is chemically-mechanically polished, and the substrate is returned to the cassette. The substrate is not returned to the cassette between the electrodeposition and polishing steps.

Implementations of the invention may include the following. The substrate may be cleaned or cleaned and dried prior to being returning to the cassette. The substrate may be rinsed with a solution which may include a surfactant prior to electrodeposition.

Advantages of the invention may include one or more of the following. A single tool integrates the electrodeposition and chemical-mechanical polishing processes. The danger of substrate contamination is reduced. The tool may have a single interface which accepts and returns a dry, clean wafer. The tool improves throughput by eliminating unnecessary drying and cleaning steps between the electrodeposition and chemical-mechanical polishing steps. In addition, by eliminating unnecessary drying equipment, the footprint and cost of the tool are reduced.

Other features and advantages of the invention will be apparent from the description which follows, including the claims and drawings.

BRIEF DESCRIPTION OF THE DRAWINGS

FIG. 1 is a schematic top view of an integrated tool for electrodeposition and CMP with a "linear" arrangement of stations.

FIG. 2 is a schematic side view, partially cross-sectional, of a holding tub and a substrate-handling robot from FIG. 1.

FIG. 3 is a schematic cross-sectional view of an electroplating station from FIG. 1.

FIG. 4 is a schematic side view of a CMP apparatus from FIG. 1.

FIG. 5 is a schematic top view of an integrated tool for electrodeposition and CMP with a "cluster" arrangement of stations and a dry-in/dry-out interface.

FIGS. 6 and 7 are schematic cross-sectional views of a load lock from FIG. 5, incorporating a dryer and a rinser, respectively.

FIG. 8 is a schematic top view of an integrated tool for electrodeposition and CMP with a "linear" arrangement of stations and a dry-in/dry-out interface.

FIG. 9 is a schematic top view of another embodiment of an integrated tool for electrodeposition and CMP with a "linear" arrangement of stations and a dry-in/dry-out interface.

DETAILED DESCRIPTION

In the following description, the term "substrate" broadly covers any object that is subjected to electrodeposition and chemical mechanical polishing. The term "substrate" includes, for example, semiconductor wafers and disks used for magnetic memory.

Referring to FIG. 1, a fabrication tool 10 provides a wet interface with the other tools in the fabrication process. That is, finished substrates from tool 10 are wet and require drying. The fabrication tool 10 includes a rinse or wetting station 12, an electrodeposition station 14 for metalizing substrates, a CMP apparatus 16 for planarizing substrates, and a substrate handling robot 18 for transporting substrates between the rinse station, electrodeposition station and CMP apparatus. Electrodeposition station 14 may be located on one side of the rinse station, and CMP apparatus 16 may be located on the other side of the rinse station. The robot 18 moves along a generally linear path to carry substrates between rinse station 12, electrodeposition station 14 and CMP apparatus 16. Each of these elements, i.e., rinse station 12, electrodeposition station 14, CMP apparatus 16, and robot 18, will be discussed in further detail below.

One or more substrates 20 are brought to fabrication tool 10 in a cassette 22. The substrates 20 are supported in cassette 22 in a generally upright and parallel configuration. The cassette 22 is lowered into the rinse station, e.g., by hand or by the robot, for temporary storage. Each substrate 20 is transported to electrodeposition station 14 for metallization, and then to CMP apparatus 16 for polishing. Then the substrate is returned to the cassette. Once all of the substrates have been processed, the cassette is removed from the fabrication tool. Although a cassette is generally used to hold multiple substrates, it is understood that a single substrate could be held in the cassette. Notwithstanding the foregoing, the description will generally refer to a cassette as holding multiple substrates.

Referring to FIG. 2, rinse or wetting station 12 includes a holding tub 30 filled with a liquid bath 32, such as deionized water. The cassettes are stored in holding tub 30 to keep the substrates therein wet. Cassettes may be placed at two cassette holding locations 34a and 34b, although the holding tub could have room for a different number of cassettes. By continuously circulating the fluid of liquid bath 32 through ports 38, e.g., with a filtration apparatus (not shown), the substrates may be kept clean. An ultrasonic generator 36 may be placed at the bottom of holding tub 30 to subject the substrates to megasonic cleaning. In addition, liquid bath 32 could include a surfactant to improve the electroplating process.

Substrates are moved between the rinse station and the electrodeposition station by robot 18. Robot 18 includes a laterally moveable link 150 which descends from a horizontal overhead track 152. The link 150 is rotatable about its vertical axis, and is extendable and retractable along that vertical axis. The robot arm also includes a blade 154 which is pivotally attached to link 150 by a wrist assembly 156. Wrist assembly 156 is rotatable about a horizonal axis. Blade 154 includes a vacuum recess (not shown) to vacuum chuck a substrate. In operation, link 150 extends so that blade 154 descends into holding tub 30, the blade chucks the substrate, and then the link retracts to lift the substrate out of the liquid bath. Then link 150 moves laterally to carry the substrate to electrodeposition station 14. When the electrodeposition process is complete, blade 154 carries the substrate to CMP apparatus 16, and once the polishing operation is complete, blade 154 carries the substrate back to cassette 22.

Referring to FIG. 3, electrodeposition station 14 deposits a metal layer, such as copper, on the substrate. Electrodeposition station 14 includes a chamber 40 containing an electrodeposition bath 42 and a substrate support assembly 46 to hold the substrate in the electrodeposition bath. In addition, electrodeposition station 14 may include a bath control system 44 to control various electrochemical properties of the electrodeposition bath, such as temperature, pH, and chemical concentration. Bath control system 44 may also include a waste treatment mechanism.

Substrate support assembly 46 may include a vertically moveable base 48 and three or more vertically moveable and rotatable fingers 50 which project downwardly from the base (only two are shown in the cross-sectional of FIG. 3). To process a substrate at the electrodeposition station, a port 52 in a sidewall 54 of chamber 40 opens, and blade 154 carries the substrate through the port into the chamber. The fingers 50 descend and rotate inwardly so that the finger prongs are beneath the substrate. Then the fingers are raised until they are just below the substrate. Then the blade releases the substrate by turning off the vacuum. Once the substrate is deposited on the fingers, the blade retracts. The fingers may then be raised to bring the substrate closer to the base. Finally, base 48 descends to lower the substrate into electrodeposition bath 42. Base 48 may spin during the electrodeposition process to rotate the substrate and thus improve deposition uniformity. When the electrodeposition process is complete, the above steps are performed in reverse order to remove the substrate from the electrodeposition station.

If an electroplating process is to be performed, electrodeposition station 14 will include a metal anode 56 and a voltage source 58. Voltage source 58 applies a voltage between the substrate and the anode to create an electrolytic reaction. Voltage source 58 may be connected to support assembly 46 to provide an electrical connection to the substrate.

On the other hand, if an electroless plating process is to be performed, then the anode and voltage source are not required. Instead, electrodeposition bath 42 will contain a chemical solution which autocatalytically precipitates the metal to be deposited. Electrodeposition bath 42 may include a metal ion source, a reducing agent for the ion source, a chelating or complexing agent for the released metal ions, and a pH adjustor. Other additives may be included in the bath to increase its stability and regulate the properties of the deposited layer. A more complete discussion of the chemistry of electroless plating is presented by Yosi Shacham-Diamond et al., in *Electroless copper deposition for ULSI*, Thin Solid Films 262, 1995, pp. 93–103, the entirety of which is hereby incorporated by reference. Although fabrication tool 10 is shown with only one electrodeposition station, there could be multiple electrodeposition stations. The number of electrodeposition stations will be selected to match the throughput capacity of the CMP apparatus while minimizing the footprint of the tool.

Once metallization is completed at electrodeposition station 14, the substrate is transported to CMP apparatus 16. Specifically, the substrate may be sent to the CMP station without being sent back to the cassette. Since both electrodeposition and CMP are wet processes, it is not necessary to dry the substrate between these two steps. This increases the throughput of the fabrication tool by eliminating an unnecessary step.

Referring to FIG. 4, CMP apparatus 16 includes a machine base 61 which supports three polishing stations 60 and a transfer station 62 (only one polishing station is shown in the side view of FIG. 4). A more detailed description of CMP apparatus may be found in U.S. application Ser. No. 08/549,336, entitled, RADIALLY OSCILLATING CAROUSEL PROCESSING SYSTEM FOR CHEMICAL MECHANICAL POLISHING, filed Oct. 27, 1995 by Perlov et al., and assigned to the assignee of the present invention, the entirety of which is hereby incorporated by reference. Although CMP apparatus 16 is shown with three polishing stations, there could be one, two, or more than three polishing stations.

The three polishing stations form a generally square arrangement with the transfer station. Each polishing station 60 includes a rotatable platen 64 on which is placed a polishing pad 66. Each polishing station 60 may include an associated pad conditioner apparatus 68 (see FIG. 1) to maintain the roughness of the polishing pad. Transfer station 62 may serve multiple functions, including receiving individual substrates from the robot, washing the substrates, loading the substrates into carrier heads, receiving the substrates from the carrier heads, washing the substrates again, and finally transferring the substrates back to the robot.

CMP apparatus 16 also includes a rotatable multi-head carousel 70 positioned above the polishing stations. Carousel 70 is supported by a center post 72 and is rotatable thereon by a carousel motor (not shown) located within machine base 61. The carousel 70 supports four carrier heads 74 (only two are shown in the side view of FIG. 4). Three of these carrier heads receive and hold substrates and polish them by pressing them against the polishing pads of polishing stations 60. One of the carrier heads receives a substrate from and delivers a substrate to transfer station 62. The carousel may rotate to move the carrier heads between the polishing stations and the transfer station.

During polishing, the platen rotates as each carrier head independently rotates about its own axis and independently laterally oscillates in a radial slot. A slurry is supplied to the surface of the polishing pad by a slurry supply port or slurry supply arm (not shown). The combination of the relative motion of the substrate and polishing pad with the slurry polishes the substrate. Once the polishing operation has been completed on the substrate, the carrier head moves the substrate to the transfer station, then the robot removes the substrate from the transfer station and returns it to cassette 22 in rinse station 12.

Referring to FIG. 5, in another embodiment, a fabrication tool 10' is configured as a cluster tool in which multiple stations surround a central substrate-handling robot 18'. The fabrication tool 10' provides a dry interface with the other tools in the fabrication process. Specifically, fabrication tool 10' may include three electrodeposition stations 14 and a CMP apparatus 16'. In addition, fabrication tool 10' includes a dual load lock 80, a rinse/clean/dry station 82, and a metrology station 86. The number, type, and arrangement of stations shown in FIG. 5 are exemplary, and may be changed to provide an optimal throughput. Substrates are moved from one of the load locks 80 to electrodeposition stations 14' for metallization. One of the electrodeposition stations may serve as a wetting station to rinse the substrate with deionized water which may include a surfactant to improve the electrodeposition process. In this case, the substrate is moved from the wetting station to another electrodeposition station for metallization. Once the metallization process is complete, the thickness of the deposited layer is measured at metrology station 86, and then the substrates are polished with CMP apparatus 16'. The substrates may be rinsed at a rinse/clean/dry station 82 or at transfer station 62 prior to polishing at CMP apparatus 16' to remove acid from the surface of the substrate. Finally, the substrates are cleaned and dried at rinse/clean/dry station 82 and returned to load lock 80. It is understood that rinse/clean/dry station 82 may include any combination of conventional rinsing or cleaning or drying apparatus or process steps.

Referring to FIG. 6, each load lock 80 serves as the entry and/or exit point for the substrates to fabrication tool 10'. One of the load locks could be dedicated as an entry port and the other load lock could be dedicated as an exit port, or both load locks could be used as combination entry/exit ports. The cassette 22 carrying substrates 20 is placed on a support 90 and loaded into load lock 80. Support 90 pivots to rotate cassette 22 into a load lock chamber 92 so that substrates 20 are arranged in a generally horizontal orientation. Support 90 is connected to a vertically moveable indexing arm 96. A sliding door 94 closes to seal load lock chamber 92. One or more heaters 98 may be located in load lock chamber 92, and a set of air nozzles 100 may be located at the ceiling of the load lock chamber. An inner wall 102 of load lock 80 includes a generally horizontal transfer port 104 for the transfer of substrates into and out of load lock chamber 92. Indexing arm 96 may move support 90 vertically so that one substrate is aligned with transfer port 104.

Returning to FIG. 5, robot 18' includes a rotatable base 110, two inner links 112 pivotally connected to base 110, four outer links 116 connected pivotally to inner links 112, and two end effectors 120, each connected to two of the four outer links 116. Inner links 112 may execute a scissors-motion so that one end effector moves radially inward and the other end effector moves radially outward. In addition, base 110 may rotate to swing the end effectors into a position adjacent the desired station. Base 110 may also be vertically moveable. End effectors 120 may be provided with a vacuum recess (not shown) to vacuum chuck the substrates, with a mechanical clamp to grasp the substrate, or with another conventional substrate handling system.

In operation, one of the end effectors extends through the transfer port into the chamber of load lock 80. The end effector vacuum chucks a substrate and retracts radially to remove the substrate from the load lock. Then, base 110 rotates to swing the end effector into position adjacent an electrodeposition station. Finally, the end effector is extended to transfer the substrate into the electrodeposition station. Once metallization is completed at the electrodeposition station, the substrate is rinsed by robot 18' to rinse/clean/dry station 82 so that the chemicals from the electrodeposition process may be removed. Then, robot 18' moves the substrate to transfer station 62 of CMP apparatus 16'.

After the substrate has been rinsed, robot 18' retrieves the substrate and inserts it into metrology station 86 so that the thickness of the deposited layer may be measured. Metrology station 86 may measure the layer thickness with any of a variety of conventional techniques, such as ultrasound or x-rays. Further, the metrology information may be used to adjust subsequent electroplating of other wafers or it may be used to adjust the polishing of the measured substrates. For example, a polishing parameter, such as the total polishing time, could be adjusted, based on the measured thickness. Further, because the deposited layer will be polished by the CMP apparatus, it is permissible to use a metrology instrument which directly contacts the surface of the substrate.

Alternately, the substrate may be retrieved from electrodeposition station 14' and be inserted into metrology station 86 before being rinsed. In this case, the rinsing may occur after the metrology step at either rinse/clean/dry station 82 or transfer station 62 of CMP apparatus 16'.

Following the metrology step, the substrate is transported to transfer station 62 of CMP apparatus 16' for polishing. The process parameters of the CMP apparatus may be adjusted based on the measured thickness of the deposited layer. Once polishing of the substrate is complete, robot 18' inserts the substrate into rinse/clean/dry station 82. The rinse/clean/dry station 82 is intended to remove excess slurry particles which may have adhered to the substrate surface. The rinse/clean/dry station may be, for example, a combination brush/scrub cleaner with a centrifugal drier or a rinse bath with an IPA vapor drier. It is understood that the rinse/clean/dry station may include any combination of conventional rinsing or cleaning or drying apparatus. Finally, the substrate is returned to load lock 80. Since the rinse/clean/dry station provides a clean, dry substrate to the load lock, fabrication tool 10' provides a dry interface with other tool in the fabrication process.

Alternately, the rinse/clean/dry station may provide only rinse and clean the substrates, and the drying step may be performed at load lock 80. Heat from heaters 98 and air jets from nozzles 100 dry the substrates so that the load lock provides a dry interface. Also, the thickness of the metal layer could be measured at metrology station 86 after polishing, but before the substrate is sent to rinse/clean/dry station 82.

Referring to FIG. 7, in another embodiment, load lock 80' incorporates a rinsing or cleaning function and provides a wet interface. The bottom portion of chamber 92' is filled with a rinse bath 160, and nozzles 162 may be located on the ceiling of the chamber. To wash the substrates, indexing arm 96' lowers support 90' and the attached cassette so as to submerge the substrates in the rinse bath. In addition, nozzles 162 may spray a cleaning fluid on the substrates as they are lowered into the rinse bath.

Referring to FIG. 8, in another embodiment, a fabrication tool 10" has a linear arrangement of stations and provides a dry interface. The fabrication tool 10" includes a load lock holding station 132, a series of electrodeposition stations 14", metrology station 130, CMP apparatus 16", a rinse/clean/dry station 134, and a robot 18" to move the substrates between the stations. It is understood that rinse/clean/dry station 134 may include any combination of conventional rinsing or cleaning or drying apparatus or process steps.

The load lock holding station 132 has several, e.g., four, cassette holding locations 140. Cassettes 22 are moved through a window 148 in a clean room wall 142 into the load lock holding station 132 by a second robot 144. The second robot 144 may take new wafers from the cassettes in the load lock holding station and either hand the substrate to robot 18" or insert the substrate into clean/dry station 134. The robot 18" then receives the substrate, either directly from second robot 144 or from clean/dry station 134, and places it in one of the electrodeposition stations 14".

Following the electrodeposition process, the thickness of the deposited layer is measured at the electrodeposition station, and the substrate is polished with the CMP apparatus. Once polishing of the substrate is complete, robot 18" inserts the substrate into rinse/clean/dry station 134. The clean/dry station may be, for example, a combination brush/scrub cleaner with a centrifugal dryer or a rinse bath with an IPA vapor dryer. Once the substrate has been cleaned, second robot 144 may extend through port 146 in the clean/dry station to collect the substrate and return it to the original slot in the original cassette from which it was removed. Finally, the second robot may move the cassettes out of the load lock holding station for transportation to another tool.

Referring to FIG. 9, in another embodiment, a fabrication tool 10''', provides another linear arrangement of stations. The fabrication tool 10''' includes dual load locks 80''', an electrodeposition stations 14''', a metrology station 86''', a CMP apparatus 16''', a rinse/clean/dry station 82''', and a robot 18''' to move the substrates along a substantially linear path between the aforementioned stations. The fabrication tool 10''' is compatible with a dry-in/dry-out interface.

In summary, a fabrication tool which integrates an electrodeposition station with a CMP apparatus may transport substrates from the electroplating stations to the CMP apparatus without an intervening cleaning step. The substrate may be sent from the electrodeposition station to the CMP apparatus, without being sent back to the cassette which is the initial and final holder. In addition, the thickness of the electrodeposited layer may be measured at a metrology station prior to polishing utilizing an instrument which physically contacts the surface of the substrate, and this thickness measurement may be used to modify a processing parameter. Furthermore, the fabrication tool may have a single interface in which a dry and clean wafer is returned to the interface.

Although the present invention has been described in terms of the forgoing embodiments, such description has been for exemplary purposes only and, as will be apparent to those of ordinary skill in the art, many alternatives, equivalents, and variations of varying degrees will fall within the scope of the present invention. For example, the holding tub 30 could alternatively be designed to employ active sprayers to keep the substrates wet and clean, rather than to maintain the substrates in a submerged condition; the transfer chamber of FIG. 5 could employ sprayers to keep the substrates wet and clean; and the cassette may hold one or multiple substrates. Substrates could travel into and out of the electrodeposition station along different routes to provide higher throughput and cleanliness. Cassettes could be loaded into the load lock either by a robot in the tool or by factory automation. The scope, accordingly, is not limited in any respect by the foregoing description, rather, it is defined only by the claims that follow.

What is claimed is:

1. A method of manufacturing a semiconductor device, comprising:

electrodepositing a metal layer onto a substrate using an aqueous chemical solution; and chemically-mechanically polishing the metal layer;

wherein the substrate is not dried between the electrodeposition and polishing steps.

2. The method of claim 1 wherein the metal is copper.

3. The method of claim 1 further comprising extracting the substrate from a slot in a cassette, transporting the substrate to an electrodeposition station for electrodeposition, transporting the substrate to a chemical mechanical polishing apparatus for polishing, and returning the substrate to the slot in the cassette following polishing.

4. The method of claim 3 further comprising cleaning the substrate prior to returning the substrate to the cassette.

5. The method of claim 1 further comprising measuring the thickness of the metal layer prior to polishing.

6. The method of claim 5 further comprising using the measured thickness to modify a polishing parameter.

7. The method of claim 5 further comprising using the measured thickness to modify an electrodeposition parameter.

8. The method of claim 5 further comprising measuring the thickness of the metal layer after polishing.

9. The method of claim 1 further comprising rinsing the substrate between electrodeposition and polishing.

10. The method of claim 1 further comprising cleaning and drying the substrate following polishing.

11. A method of manufacturing a semiconductor device, comprising:

withdrawing a substrate from a cassette;

electrodepositing a metal layer onto the substrate;

chemically-mechanically polishing the metal layer; and returning the substrate to the cassette, wherein the substrate is not returned to the cassette between the electrodeposition and polishing steps.

12. The method of claim 11 further comprising cleaning the substrate prior to returning the substrate to the cassette.

13. The method of claim 11 further comprising cleaning and drying the substrate prior to returning the substrate to the cassette.

14. The method of claim 11 further comprising rinsing the substrate with a solution which includes a surfactant prior to electrodeposition.

15. The method of claim 11 further comprising rinsing the substrate prior to polishing.

* * * * *